United States Patent
Kamgaing et al.

(10) Patent No.: US 10,410,983 B2
(45) Date of Patent: Sep. 10, 2019

(54) MICROELECTRONIC DEVICES DESIGNED WITH HIGH FREQUENCY COMMUNICATION DEVICES INCLUDING COMPOUND SEMICONDUCTOR DEVICES INTEGRATED ON AN INTER DIE FABRIC ON PACKAGE

(71) Applicant: Intel Corporation, Santa Clara, CA (US)

(72) Inventors: Telesphor Kamgaing, Chandler, AZ (US); Georgios C. Dogiamis, Chandler, AZ (US); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,152

(22) PCT Filed: Dec. 22, 2015

(86) PCT No.: PCT/US2015/000486
§ 371 (c)(1),
(2) Date: May 2, 2018

(87) PCT Pub. No.: WO2017/111865
PCT Pub. Date: Jun. 29, 2017

(65) Prior Publication Data
US 2018/0323159 A1 Nov. 8, 2018

(51) Int. Cl.
*H01L 23/00* (2006.01)
*H01L 23/66* (2006.01)
(Continued)

(52) U.S. Cl.
CPC .......... *H01L 23/66* (2013.01); *H01L 23/5384* (2013.01); *H01L 23/5389* (2013.01);
(Continued)

(58) Field of Classification Search
CPC ... H01L 23/5384; H01L 23/66; H01L 23/552; H01L 24/16
See application file for complete search history.

(56) References Cited

U.S. PATENT DOCUMENTS

| 2010/0059854 A1* | 3/2010 | Lin ......................... H01L 25/16 257/528 |
| 2011/0147920 A1 | 6/2011 | Choudhury et al. |

(Continued)

FOREIGN PATENT DOCUMENTS

WO  WO-03-030254 A2  4/2003

OTHER PUBLICATIONS

International Search Report and Written Opinion for International Patent Application No. PCT/US2015/000486 dated Aug. 31, 2016, 13 pgs.

(Continued)

*Primary Examiner* — Elias Ullah
(74) *Attorney, Agent, or Firm* — Schwabe, Williamson & Wyatt, P.C.

(57) ABSTRACT

Embodiments of the invention include a microelectronic device that includes an overmolded component having a first die with a silicon based substrate. A second die is coupled to the first die with the second die being formed with compound semiconductor materials in a different substrate. A substrate is coupled to the first die. The substrate includes an antenna unit for transmitting and receiving communications at a frequency of approximately 4 GHz or higher.

20 Claims, 8 Drawing Sheets

(51) Int. Cl.
   *H01L 23/538*  (2006.01)
   *H01L 25/10*   (2006.01)
   *H01L 23/552*  (2006.01)
   *H01L 25/18*   (2006.01)
   *H01Q 1/38*    (2006.01)
   *H01Q 1/24*    (2006.01)

(52) U.S. Cl.
   CPC ............ *H01L 23/552* (2013.01); *H01L 24/16* (2013.01); *H01L 24/20* (2013.01); *H01L 25/105* (2013.01); *H01L 25/18* (2013.01); *H01Q 1/38* (2013.01); *H01L 2223/6622* (2013.01); *H01L 2223/6672* (2013.01); *H01L 2223/6677* (2013.01); *H01L 2224/04105* (2013.01); *H01L 2224/12105* (2013.01); *H01L 2224/13025* (2013.01); *H01L 2224/14181* (2013.01); *H01L 2224/16145* (2013.01); *H01L 2224/16225* (2013.01); *H01L 2224/16227* (2013.01); *H01L 2224/16235* (2013.01); *H01L 2224/16265* (2013.01); *H01L 2225/1035* (2013.01); *H01L 2225/1058* (2013.01); *H01L 2924/1032* (2013.01); *H01L 2924/1033* (2013.01); *H01L 2924/10253* (2013.01); *H01L 2924/10329* (2013.01); *H01L 2924/15192* (2013.01); *H01L 2924/18162* (2013.01); *H01L 2924/19011* (2013.01); *H01L 2924/19104* (2013.01); *H01L 2924/19105* (2013.01); *H01L 2924/3025* (2013.01); *H01L 2924/30111* (2013.01); *H01Q 1/243* (2013.01)

(56) References Cited

U.S. PATENT DOCUMENTS

2012/0175779 A1   7/2012   Lin
2012/0280366 A1  11/2012   Kamgaing et al.
2015/0084194 A1   3/2015   Molzer et al.

OTHER PUBLICATIONS

International Preliminary Report on Patentablity for International Patent Application No. PCT/US2015/000486, dated Jul. 5, 2018, 10 pages.

* cited by examiner

MICROELECTRONIC DEVICES DESIGNED WITH HIGH FREQUENCY COMMUNICATION DEVICES INCLUDING COMPOUND SEMICONDUCTOR DEVICES INTEGRATED ON AN INTER DIE FABRIC ON PACKAGE

CROSS-REFERENCE TO RELATED APPLICATION

This patent application is a U.S. National Phase Application under 35 U.S.C. § 371 of International Application No. PCT/US2015/000486, filed Dec. 22, 2015, entitled "MICROELECTRONIC DEVICES DESIGNED WITH HIGH FREQUENCY COMMUNICATION DEVICES INCLUDING COMPOUND SEMICONDUCTOR DEVICES INTEGRATED ON AN INTER DIE FABRIC ON PACKAGE," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having high frequency communication devices including ultra small transceiver dies integrated on an inter die fabric on package.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate at 60 GHz. Other applications including automotive radar and medical imaging, utilize wireless communication technologies in the millimeter wave frequencies (e.g. 30 GHz-300 GHz). For these wireless applications, the designed RF (radio frequency) circuits are in need of high quality passive matching networks, in order to accommodate the transmission of pre-defined frequency bands (where the communication takes place) as well as in need of high power efficiency amplifiers and low loss, power combiners/switches.

DETAILED DESCRIPTION OF THE INVENTION

Described herein are microelectronic devices that are designed with high frequency communication devices including compound semiconductor devices in an inter die fabric on package. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the designed RF circuits (e.g., low-noise amplifiers, mixers, power amplifiers, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality passives, mainly due to the typically lossy silicon substrate employed. CMOS circuits are traditionally integrated on silicon wafers with substrate resistivity in the milli Ohm-cm to a few Ohm-cm range. This results in low quality factor passive components, high power losses, reduced transmission range, a lower system performance, and increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design includes high frequency components (e.g., 5G transceiver) and utilizes non-CMOS technologies (e.g., non-silicon substrates) for critical parts of a communication system (e.g., GaAs, GaN, Passives-on-Glass, etc.). With an optimal system partitioning, critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.). The full communication system will be formed in an inter die fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

An approach to improve the electrical performance of highly integrated circuits includes implementing passive components on either a traditional package substrate that utilizes either polymer-based organic materials or low temperature co-fired ceramic. Another approach includes using passives integrated on short loop (e.g., fewer semiconductor processing operations due to no transistors, etc.) silicon or glass substrates. This technology is known as integrated passive device (IPD) technology and does not include active devices. The IPDs are manufactured in a semiconductor manufacturing environment leading to extremely high accuracy passives. Thus, for next generation wireless communication, partitioning passive components at the system level becomes very important.

Digital and analog circuitry implemented on low to medium resistivity semiconductor substrates can be combined with group III-V devices and off-chip passive circuits to deliver excellent performance. With passive/die partitioning, the size of the aforementioned CMOS die can become ultra-small (e.g., 1-3 mm for length and width dimensions). This poses a major challenge for a system in which inter die or die to die connection is critical to reduce the form factor while improving the electrical performance by removing inter die parasitic inductance. Such parasitic inductances are comparable to the inductances (e.g., 0.1 pH to 400 pH) of typical inductive components (e.g., inductors, transformers) used currently and also in future mm-wave circuits.

In one embodiment, the present design is a 5G ($5^{th}$ generation mobile networks or $5^{th}$ generation wireless systems) architecture having non-CMOS based transceiver building blocks (such as group III-V based devices or dies) that are co-integrated on the same package with low frequency circuits and integrated passive devices (IPDs) for performance enhancement and thermal requirements relaxation. In this arrangement; dies are assembled on top of an overmolded component which includes an ultra small primary die (e.g., CMOS die) and possible other components (e.g., IPDs, filters, group III-V dies, etc.). The overmolded component is then connected to a package substrate. The package substrate may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points.

In one example, the present design architecture includes non-CMOS transceiver building blocks (e.g., group III-V dies) or integrated passive devices or dies (IPDs) are initially assembled on an overmolded component that includes a CMOS die having low frequency circuits (e.g., frequency less than 30 GHz, frequency less than 20 GHz) and then integrated with an antenna package. This design architecture results in performance enhancement, miniaturization, and thermal requirements relaxation. In this architecture, the components can be assembled using diverse manufacturing approaches (e.g., assembled at wafer level). A final communication module may utilize integrated antennas.

The design of this 5G architecture provides optimized performance for high frequency transceivers based on using compound semiconductor materials for certain components (e.g., switches, power amplifier) and integrated passive devices or dies (IPDs) for better quality passives. Capacitor and inductors values are too low at mm-wave frequencies for integration on package. Direct assembly of IPDs on a SoC die removes parasitic inductance and capacitance, which can be very substantial at mm-wave frequencies. The implementation of a communication module at mm-wave frequencies also enables integration of the antenna unit on the package as the transceiver modules. Overmolding of a single die enables all RF components on one side of a package. Trace layers or redistribution layers enables the use of less interconnect for power deliver and control signals. The present design can include, through mold interconnects, thru mold connections, thru substrate connections, or vias from a first substrate or first die to a second substrate or die for vertically passing high frequency (e.g., at least 25 GHz) RF signals to the second substrate or the second die (e.g., the second substrate or die is vertically aligned with the first substrate or the first die) which leads to a shorter path for the RF signals and thus less path loss. The present design also results in reduced cost due to having a first substrate designed for antennas or antenna components and a second substrate designed for higher frequency components. The functional testing of transceiver components, which may utilize in-mold-circuits, are decoupled from the need to assemble them initially on the package. Additionally, a wireless 5G module, which comprises RFIC with or without on-package antenna, can be designed and sold as a separate module. Functional blocks such as impedance matching circuits, harmonic filters, couplers, power combiner/divider, etc. can be implemented with IPDs. IPDs are generally fabricated using wafer fab technologies (e.g., thin film deposition, etch, photolithography processing).

Figure 1:
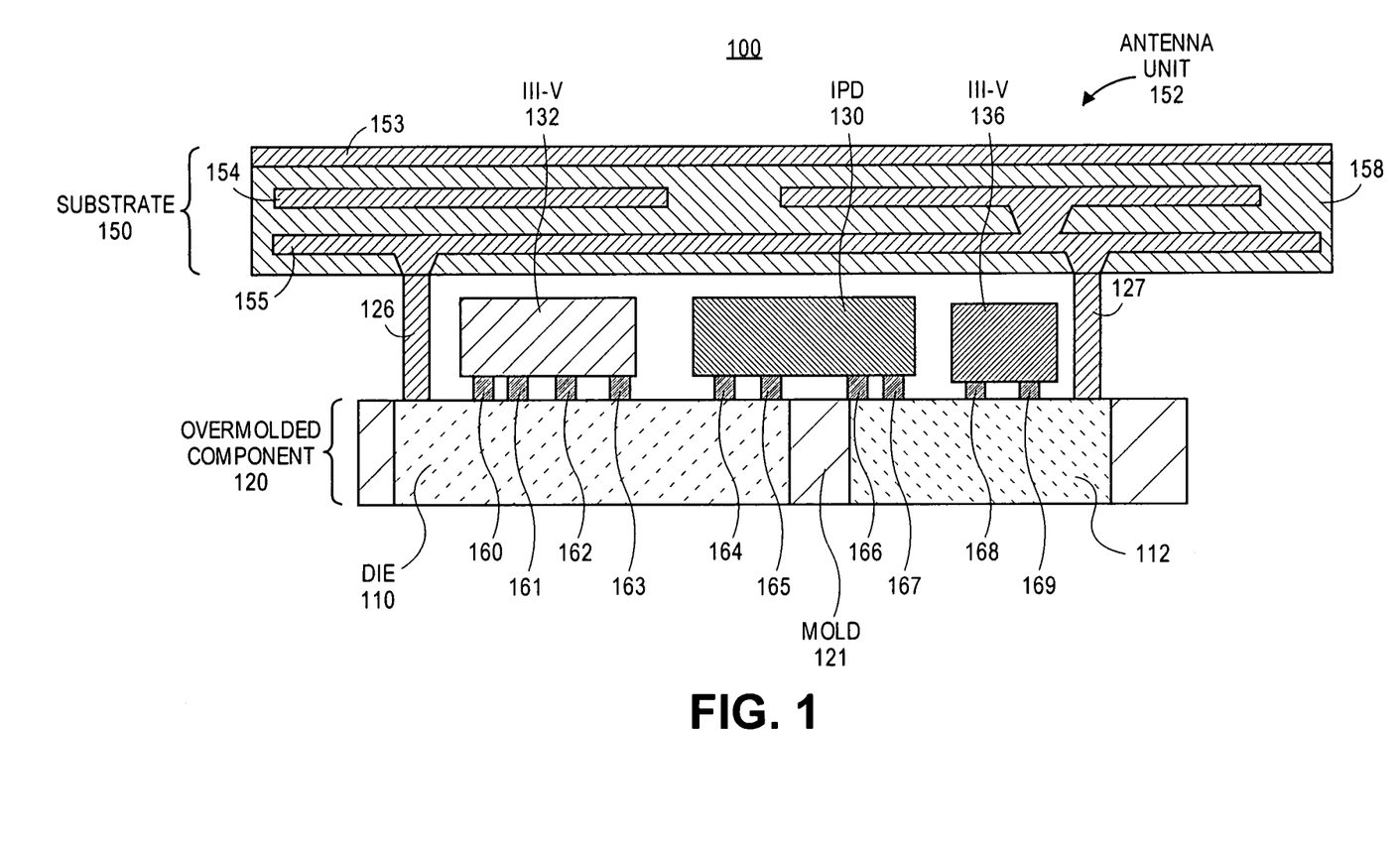
FIG. 1 illustrates co-integrating different components in a microelectronic device (e.g., a die fabric architecture) in accordance with one embodiment.

FIG. 1 illustrates co-integrating different components in a microelectronic device (e.g., a die fabric architecture) in accordance with one embodiment. The microelectronic device 100 (e.g., a die fabric architecture 100) includes an overmolded component 120 and a substrate 150. The overmolded component 120 includes an overmold that partially surrounds CMOS circuitry of a die 110 (e.g., die with silicon based substrate, CMOS circuitry having at least one baseband unit and at least one transceiver unit formed with a silicon based substrate, CMOS die) and component 112 (e.g., IPD 112, filter 112, group III-V die, Silicon on Insulator (SOI) die, etc.). The mold material 121 may be a low loss nonconductive dielectric material and the shielding may be made out of a conductive material. Circuitry or devices (e.g., individual transistors, groups of transistors) of a die 132 formed with compound semiconductor materials (e.g., group III-V materials, gallium arsenide (GaAs), gallium nitride (GaN), compound semiconductor die, etc.) or organic materials is coupled with electrical connections 160-163 to the die 110. The circuitry or devices of a die 136 having formed with compound semiconductor materials (e.g., group III-V materials, gallium arsenide (GaAs), gallium nitride (GaN), compound semiconductor die, etc.) or silicon-oninsulator material (e.g., SOI material having switches) or organic materials is coupled with electrical connections 168-169 to the component 112. The IPD 130 can function as a bridge between die 110 and component 112 based on the electrical connections 164-167. The substrate 150 includes an antenna unit 152 with at least one antenna for transmitting and receiving high frequency communications (e.g., 5G, WiGig, at least 25 GHz, at least 28 GHz, at least 30 GHz). The substrate 150 may optionally include various components (e.g., switches, switches formed in compound semiconductor materials, any type of device or circuitry, filters, combiners, etc). Additional components such as traditional surface-mount passives may also be mounted to the package. The substrate 150 includes conductive layers 153-155 of the antenna unit 152. In this example, the electrical connections 126 and 127 couple the die 110 and the component 112 to the antenna unit 152. The substrate 150 includes one or more dielectric layers 158 for isolation between conductive layers 153-155.

In one embodiment, if a total height of die 110 or component 112 and a tallest component (e.g., compound semiconductor dies 132 and 136, IPD 130) that is supported by the die 110 or component 112 is greater than a certain height (e.g., greater than 100 microns) then an interposer substrate or pillars (e.g., connections 126, 127) are needed for assembling the substrate above these components. If a total height of die 110 or component 112 and the tallest component (e.g., compound semiconductor dies 132 and 136, IPD 130) is less than a certain height (e.g., 100 microns) then bumps can be used instead of the interposer substrate or pillars.

The substrate 150 can have a different layer count, thickness, length, and width dimensions in comparison to the layer count, thickness, length, and width dimensions of the substrate 150 of FIG. 1. In one example, components of the substrate which primarily dominate a packaging area are partitioned in a separate lower cost and lower circuit density substrate 150 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one embodiment, the device 100 is a wireless module that includes at least one CMOS die 110 functioning as baseband, transceiver, or a combination of both. Off-chip passive components are integrated on a semi-insulating or fully insulating semiconductor substrate to achieve digital, analog, and RF functionalities. Furthermore, group circuits are used for a substantial portion of the RF front end functions. The dies are interconnected together either directly or through a molding compound that may have electrically conductive traces. The whole inter-die fabric is attached a package fabric (e.g., substrate 150) that incorporates one or more antennas to support communication at low GHz and mm-wave frequencies. Other discrete dies or passive components include crystals and connections that may also be attached to the package substrate.

In one example, the die 110 can have dimensions ranging from approximately 200×200 microns to 3×3 millimeter. The dimensions of the die 110 are smaller than the dimensions of the combination of dies attached on top of the die 110 and component 112. In one embodiment, the antenna unit 152 is located on the microelectronic device 100 as close as possible to power amplifiers (e.g., power amplifiers of dies 132 or 136) to minimize path losses. The substrate 150 in FIG. 1 has been decoupled and separated from other substrates and components of the microelectronic device 100 to reduce cost of the device 100 due to lower cost materials for the substrate. In one example, the RF signals feeding the antenna unit 152 passes from at least one of the dies 132 and 136 through the die 110 or component 112 and then through connections 126 and 127 to the antenna unit 152.

Figure 2:
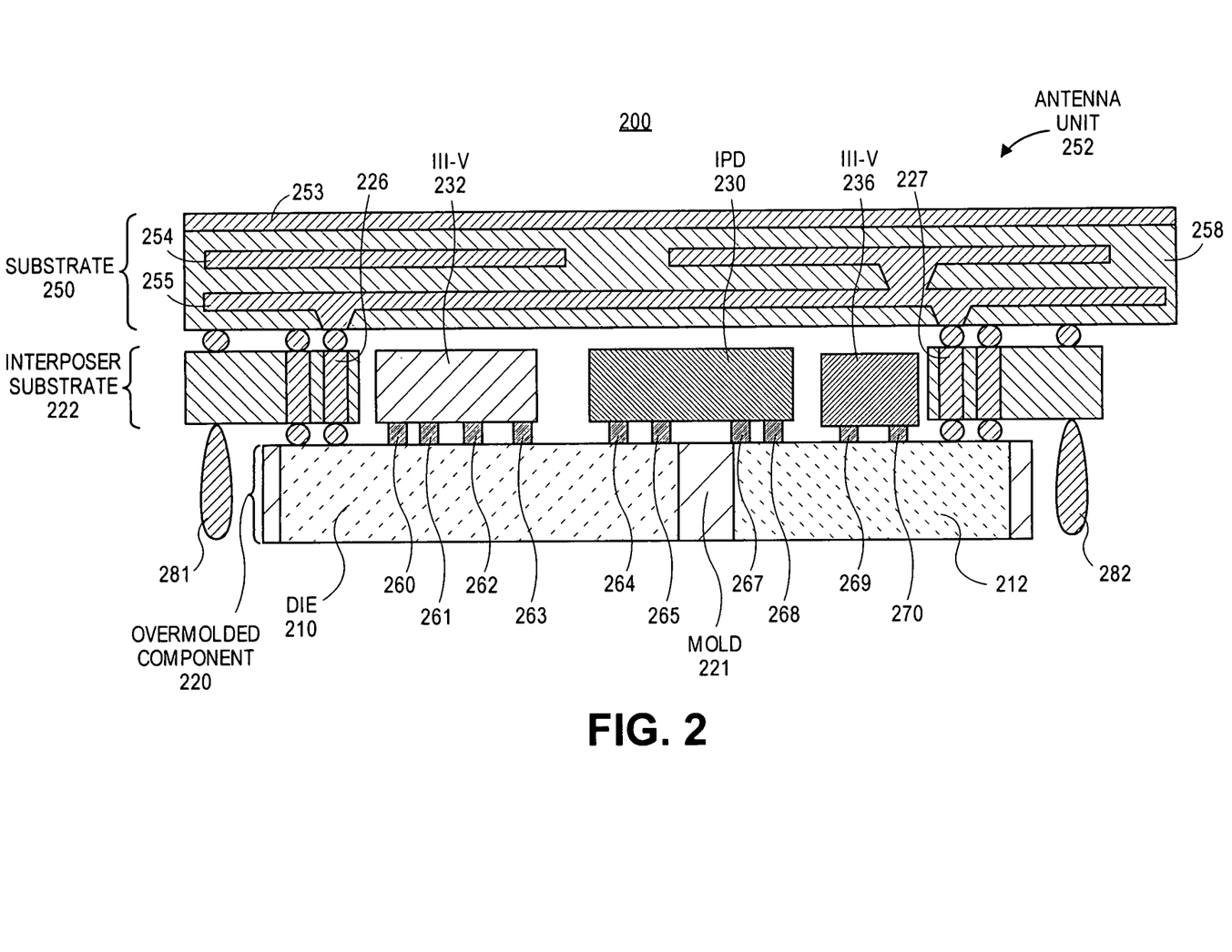
FIG. 2 illustrates co-integrating different components in a microelectronic device (e.g., a die fabric architecture) having an interposer substrate in accordance with one embodiment.

FIG. 2 illustrates co-integrating different components in a microelectronic device (e.g., a die fabric architecture) in accordance with one embodiment. The microelectronic device 200 includes similar components in comparison to the microelectronic device 100, except that electrical connections 126 and 127 has been replaced with connections of an interposer substrate 222. The microelectronic device 200 (e.g., a die fabric architecture 200) includes an overmolded component 220 and a substrate 250. The overmolded component 220 includes an overmold that partially surrounds CMOS circuitry of a die 210 (e.g., die with silicon based substrate, CMOS circuitry having at least one baseband unit and at least one transceiver unit formed with a silicon based substrate, CMOS die) and component 212 (e.g., IPD 212, filter 212, group III-V die, Silicon on Insulator (SOI) die etc.). The mold material 221 may be a low loss nonconductive dielectric material and the shielding may be made out of a conductive material. Circuitry or devices (e.g., individual transistors, groups of transistors) of a die 232 formed with compound semiconductor materials (e.g., group III-V materials, gallium arsenide (GaAs), gallium nitride (GaN), compound semiconductor die, etc.) or organic materials is coupled with electrical connections 260-263 to the die 210. The circuitry or devices of a die 236 formed with compound semiconductor materials (e.g., group III-V materials, gallium arsenide (GaAs), gallium nitride (GaN), compound semiconductor die, etc.) or silicon-on-insulator material (e.g., SOI material having switches) or organic materials is coupled with electrical connections 269-270 to the component 212. The IPD 230 can function as a bridge between die 210 and component 212 based on the electrical connections 264-267. The substrate 250 includes an antenna unit 252 with at least one antenna for transmitting and receiving high frequency communications (e.g., 5G, WiGig, at least 25 GHz, at least 28 GHz, at least 30 GHz). The substrate 250 may optionally include various components (e.g., switches, switches formed in compound semiconductor materials, any type of device or circuitry, filters, combiners, etc). Additional components such as traditional surface-mount passives may also be mounted to the package. The substrate 250 includes conductive layers 253-255 of the antenna unit 252. In this example, the electrical connections 226 and 227 of the interposer substrate 222 couple the die 210 and the component 212 to the antenna unit 252. The substrate 250 includes one or more dielectric layers 258 for isolation between conductive layers 253-255.

In one embodiment, if a total height of die 210 or component 212 and a tallest component (e.g., compound semiconductor dies 232 and 236, IPD 230) that is supported by the die 210 or component 212 is greater than a certain height (e.g., greater than 100 microns) then an interposer substrate or pillars (e.g., connections 226, 227) are needed for assembling the substrate above these components. If a total height of die 210 or component 212 and the tallest component (e.g., compound semiconductor dies 232 and 236, IPD 230) is less than a certain height (e.g., 100 microns) then bumps can be used instead of the interposer substrate or pillars.

The substrate 250 can have a different layer count, thickness, length, and width dimensions in comparison to the layer count, thickness, length, and width dimensions of the substrate 250 of FIG. 2. In one example, components of the substrate which primarily dominate a packaging area are partitioned in a separate lower cost and lower circuit density substrate 250 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one example, the interposer substrate 222 has a useful function of providing shielding of the RF dies (e.g., dies 232, 236). Grounded deep vias of the interposer substrate can provide shielding while other components of the interposer substrate can provide a power supply for the microelectronic device 200.

In one embodiment, high power, high efficiency power amplifiers, switches, and/or combiners are formed with compound semiconductor materials on the dies 232 and 236, which are directly assembled on the CMOS silicon die 210 or component 212 with solder balls or bumps 260-263 and 269-270. The IPD 230 is assembled in a similar manner and attached to a same side of the die 210 or component 212 with solder balls or bumps 264-265 and 267-268. This process can be performed with diverse manufacturing processing techniques (e.g., assembled at wafer level on the silicon die 210). In one example, the die 210 can have dimensions ranging from approximately 200×200 microns to 1×1 millimeter. This multi die or multichip module, which includes dies 210, 230, 232, and 236, can then be flip-chipped on a high density interconnect package (e.g., interposer substrate 222) that provides power distribution as well as shielding of RF circuitry with peripheral ground vias.

In one embodiment, the antenna unit 252 is located on the microelectronic device 200 as close as possible to power amplifiers (e.g., power amplifiers of dies 232 or 236) to minimize path losses. The substrate 250 in FIG. 2 has been decoupled and separated from other substrates and components of the microelectronic device 200 to reduce cost of the device 200 due to lower cost materials for the substrate. In one example, the RF signals feeding the antenna unit 252 passes from at least one of the dies 232 and 236 through the solder balls or bumps to an upper conductive layer of the die 210 and then through connections of the interposer substrate 222 to the antenna unit 252. The interposer substrate is also coupled to other components or substrates using connections 281 and 282.

Figure 3:
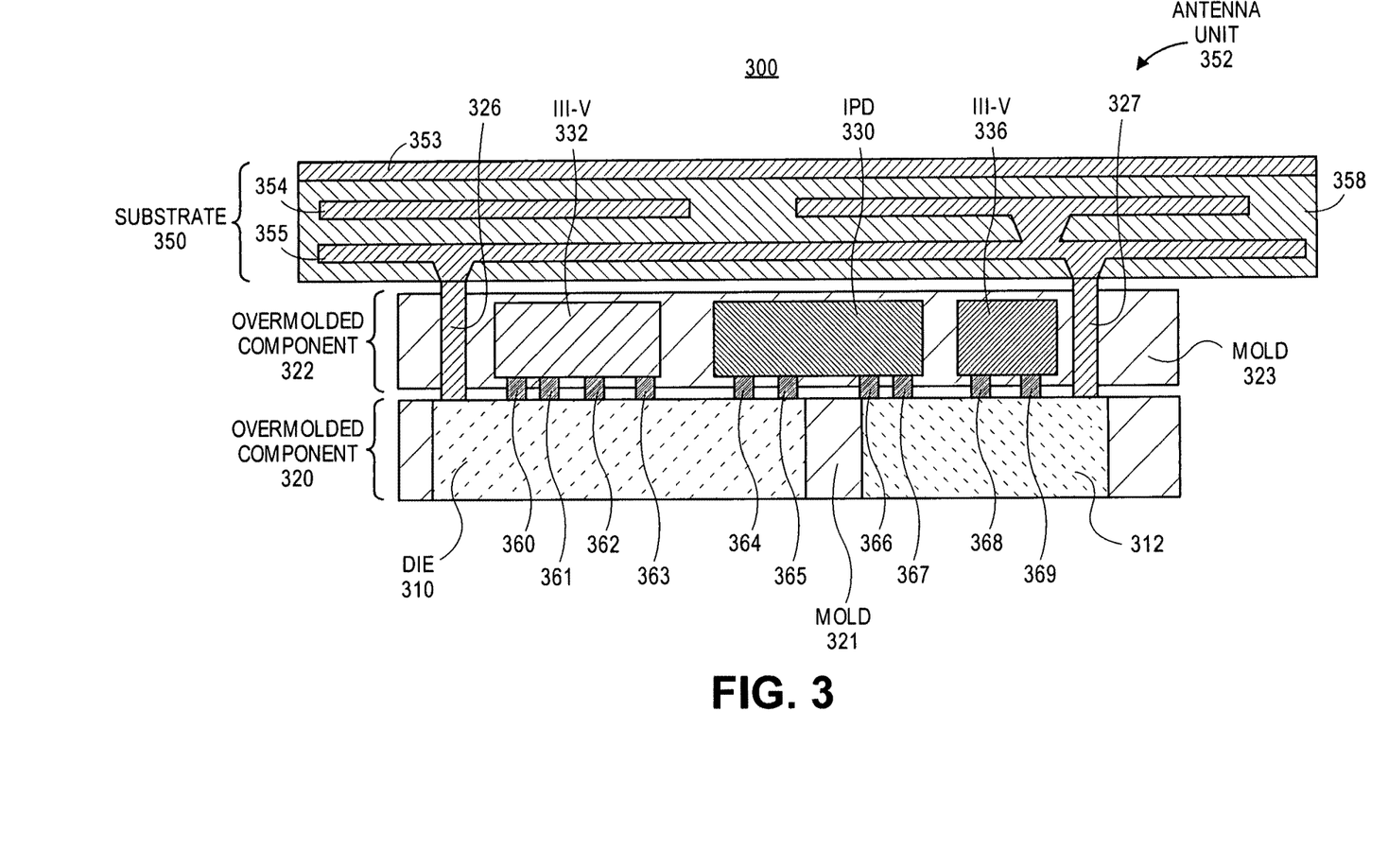
FIG. 3 illustrates co-integrating different components in a microelectronic device (e.g., a die fabric architecture) having multiple overmolded components in accordance with one embodiment.

FIG. 3 illustrates co-integrating different components in a microelectronic device (e.g., a die fabric architecture) in accordance with one embodiment. The microelectronic device 100 (e.g., a die fabric architecture 100) includes an overmolded component 320, and overmolded component 322, and a substrate 350. The overmolded component 320 includes an overmold that partially surrounds CMOS circuitry of a die 310 (e.g., die with silicon based substrate. CMOS circuitry having at least one baseband unit and at least one transceiver unit formed with a silicon based substrate, CMOS die) and component 312 (e.g., IPD 312, filter 312, group III-V die, SOI die, etc.). The mold material 321 may be a low loss nonconductive dielectric material and the shielding may be made out of a conductive material. Circuitry or devices (e.g., individual transistors, groups of transistors) of a die 332 formed with compound semiconductor materials (e.g., group III-V materials, gallium arsenide (GaAs), gallium nitride (GaN), compound semiconductor die, etc.) or organic materials is coupled with electrical connections 360-363 (e.g., solder balls, bumps, etc.) to the die 310. The circuitry or devices of a die 336 formed with compound semiconductor materials (e.g., group materials, gallium arsenide (GaAs), gallium nitride (GaN), compound semiconductor die, etc.) or SOI or organic materials is coupled with electrical connections 368-369 to the component 312. The IPD 330 (or other component) can function as a bridge between die 310 and component 312 based on the electrical connections 364-367. The overmolded component 322 includes an overmold 323 (or mold material) that partially or completely surrounds the dies 330, 332, and 336.

The substrate 350 includes an antenna unit 352 with at least one antenna for transmitting and receiving high frequency communications (e.g., 5G, WiGig, at least 25 GHz, at least 28 GHz, at least 30 GHz). The substrate 350 may optionally include various components (e.g., switches, switches formed in compound semiconductor materials, any type of device or circuitry, filters, combiners, etc). Additional components such as traditional surface-mount passives may also be mounted to the package. The substrate 350 includes conductive layers 353-355 of the antenna unit 352. In this example, the electrical connections 326 and 327 couple the die 310 and the component 312 to the antenna unit 352. The substrate 350 includes one or more dielectric layers 358 for isolation between conductive layers 353-355.

The substrate 350 can have a different layer count, thickness, length, and width dimensions in comparison to the layer count, thickness, length, and width dimensions of the substrate 350 of FIG. 3. In one example, components of the substrate which primarily dominate a packaging area are partitioned in a separate lower cost and lower circuit density substrate 350 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one embodiment, the device 300 is a wireless module that includes at least one CMOS die 310 functioning as baseband, transceiver, or a combination of both. Off-chip passive components are integrated on a semi-insulating or fully insulating semiconductor substrate to achieve digital, analog, and RF functionalities. Furthermore, group III-V and or SOI circuits are used for a substantial portion of the RF front end functions. The dies are interconnected together either directly or through a molding compound that may have electrically conductive traces. The whole inter-die fabric is attached a package fabric (e.g., substrate 350) that incorporates one or more antennas to support communication at low GHz and mm-wave frequencies. Other discrete dies or passive components include crystals and connections that may also be attached to the package substrate.

In one example, the die 310 can have dimensions ranging from approximately 200×200 microns to 3×3 millimeter. The dimensions of the die 310 are smaller than the dimensions of the combination of dies attached on top of the die 310 and component 312. In one embodiment, the antenna unit 352 is located on the microelectronic device 300 as close as possible to power amplifiers (e.g., power amplifiers of dies 132 or 136) to minimize path losses. The substrate 350 in FIG. 3 has been decoupled and separated from other substrates and components of the microelectronic device 300 to reduce cost of the device 300 due to lower cost materials for the substrate. In one example, the RF signals feeding the antenna unit 352 passes from at least one of the dies 332 and 336 through the die 310 or component 312 and then through connections 326 and 327 to the antenna unit 352.

Figure 4:
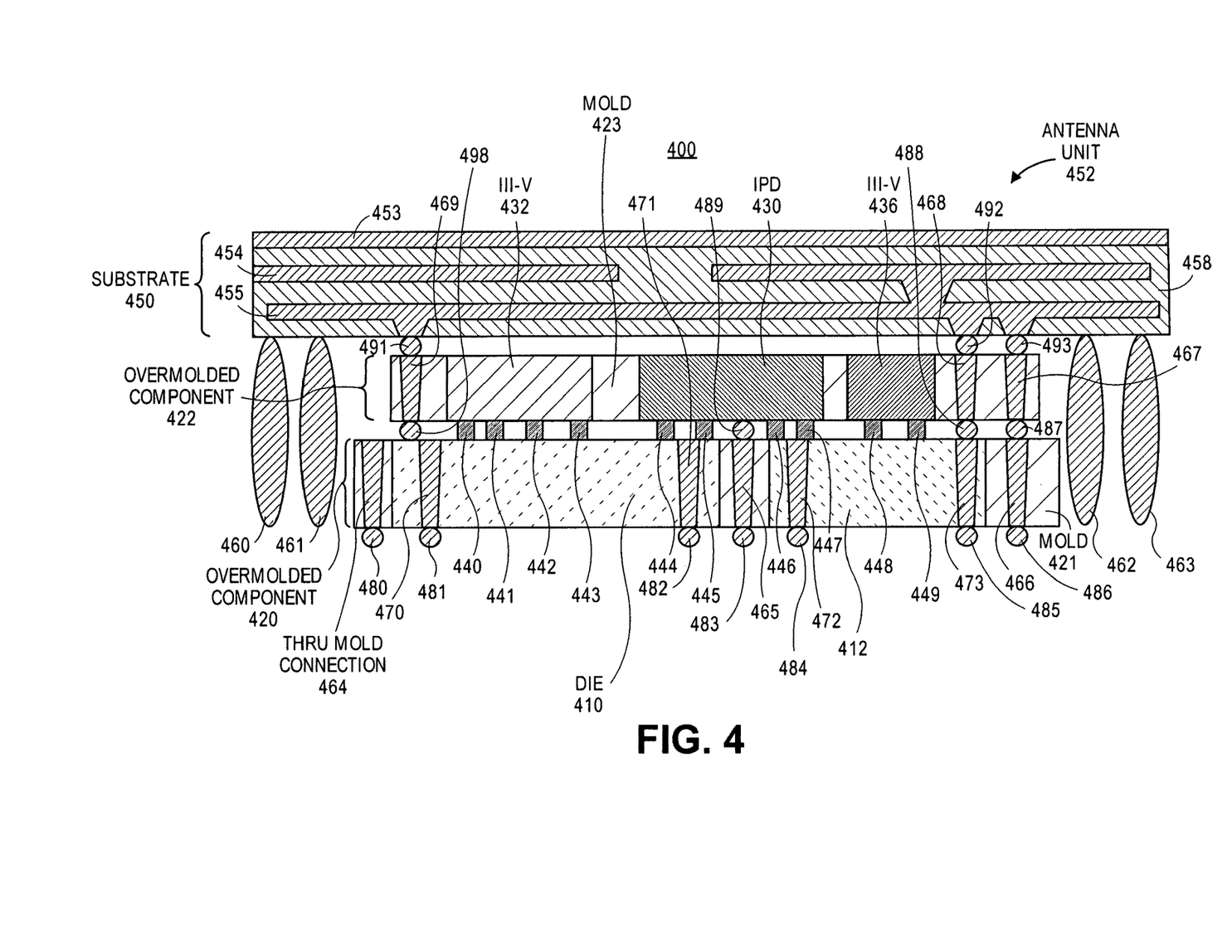
FIG. 4 illustrates co-integrating different components in a microelectronic device (e.g., a die fabric architecture) having multiple overmolded components in accordance with another embodiment.

FIG. 4 illustrates co-integrating different components in a microelectronic device (e.g., a die fabric architecture) in accordance with one embodiment. The microelectronic device 400 (e.g., a die fabric architecture 400) includes an overmolded component 420, overmolded component 422, and a substrate 450. The overmolded component 420 includes an overmold that partially or completely surrounds CMOS circuitry of a die 410 (e.g., die with silicon based substrate, CMOS circuitry having at least one baseband unit and at least one transceiver unit formed with a silicon based substrate, CMOS die) and component 412 (e.g., IPD 412, filter 412, SOI die, etc.). The mold material 421 may be a low loss nonconductive dielectric material and the shielding may be made out of a conductive material. Circuitry or devices (e.g., individual transistors, groups of transistors) of a die 432 formed with compound semiconductor materials (e.g., group III-V materials, gallium arsenide (GaAs), gallium nitride (GaN), compound semiconductor die, etc.) or organic materials is coupled with electrical connections 440-443 to the die 410. The circuitry or devices of a die 436 formed with compound semiconductor materials (e.g., group III-V materials, gallium arsenide (GaAs), gallium nitride (GaN), compound semiconductor die, etc.) or SOI or organic materials is coupled with electrical connections 448-449 to the component 412. The IPD 430 (or other component) can function as a bridge between die 410 and component 412 based on the electrical connections 444-447. The overmolded component 422 includes an overmold 423 that partially or completely surrounds the dies 430, 432, and 436.

The substrate 450 includes an antenna unit 452 with at least one antenna for transmitting and receiving high frequency communications (e.g., 5G, WiGig, at least 25 GHz, at least 28 GHz, at least 30 GHz). The substrate 450 may optionally include various components (e.g., switches, switches formed in compound semiconductor materials, any type of device or circuitry, filters, combiners, etc). Additional components such as traditional surface-mount passives may also be mounted to the package. The substrate 450 includes conductive layers 453-455 of the antenna unit 452. In this example, the electrical thru mold connections 468 and 469 couple the die 410 and the component 412 to the antenna unit 452. The substrate 450 includes one or more dielectric layers 458 for isolation between conductive layers 453-455.

The substrate 450 can have a different layer count, thickness, length, and width dimensions in comparison to the layer count, thickness, length, and width dimensions of the substrate 450 of FIG. 4. In one example, components of the substrate which primarily dominate a packaging area are partitioned in a separate lower cost and lower circuit density substrate 450 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one embodiment, the device 400 is a wireless module that includes at least one CMOS die 410 functioning as baseband, transceiver, or a combination of both. Off-chip passive components are integrated on a semi-insulating or fully insulating semiconductor substrate to achieve digital, analog, and RF functionalities. Furthermore, group III-V circuits are used for a substantial portion of the RF front end functions. The dies are interconnected together either directly or through a molding compound that may have electrically conductive traces. The whole inter-die fabric is attached a package fabric (e.g., substrate 450) that incorporates one or more antennas to support communication at low GHz and mm-wave frequencies. Other discrete dies or passive components include crystals and connections that may also be attached to the package substrate.

In one example, the die 410 can have dimensions ranging from approximately 200×200 microns to 3×3 millimeter. The dimensions of the die 410 are smaller than the dimensions of the combination of dies attached on top of the die 410 and component 412. In one embodiment, the antenna unit 452 is located on the microelectronic device 400 as close as possible to power amplifiers (e.g., power amplifiers of dies 432 or 436) to minimize path losses. The substrate 450 in FIG. 4 has been decoupled and separated from other substrates and components of the microelectronic device 400 to reduce cost of the device 400 due to lower cost materials for the substrate. In one example, the RF signals feeding the antenna unit 452 passes from at least one of the dies 432 and 436 through the die 410 or component 412 and then through connections 468 or 469 to the antenna unit 452. The overmolded components include thru mold connections 464-469 which are associated with bumps or solder balls 480-493. The dies 410 and 412 include thru substrate or die connections 470-473. Secondary level interconnects 460-463 provide electrical connections between the substrate 450 and other components or substrates.

Figure 5:
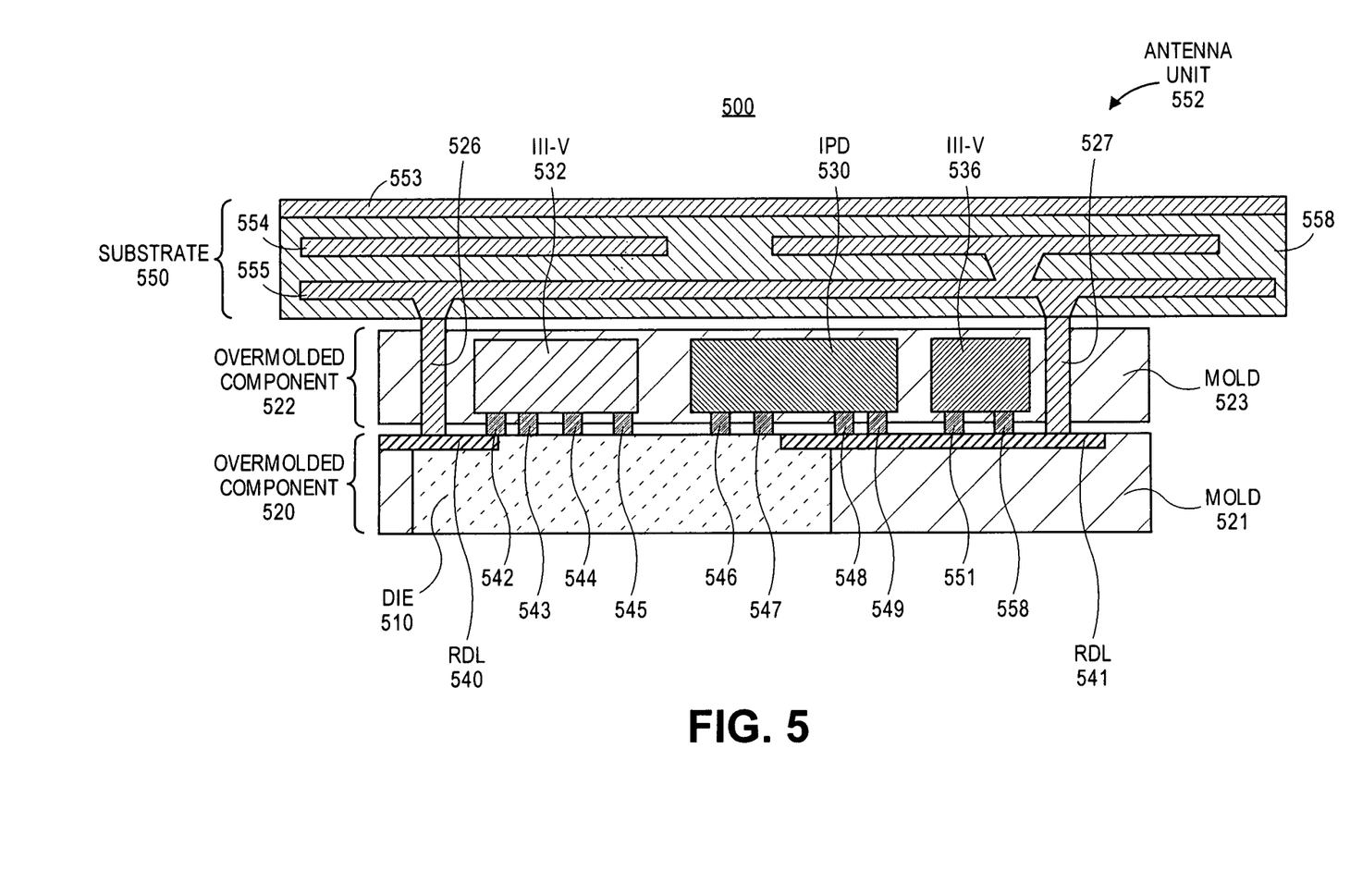
FIG. 5 illustrates co-integrating different components in a microelectronic device (e.g., a die fabric architecture) having multiple overmolded components in accordance with one embodiment.

FIG. 5 illustrates co-integrating different components in a microelectronic device (e.g., a die fabric architecture) in accordance with one embodiment. The microelectronic device 500 (e.g., a die fabric architecture 500) includes an overmolded component 520, overmolded component 522, and a substrate 550. The overmolded component 520 includes an overmold that partially surrounds CMOS circuitry of a die 510 (e.g., die with silicon based substrate, CMOS circuitry having at least one baseband unit and at least one transceiver unit formed with a silicon based substrate, CMOS die) and component 512 (e.g., IPD 512, filter 512, group III-V die, etc.). The mold material 521 may be a low loss nonconductive dielectric material and the shielding may be made out of a conductive material. Circuitry or devices (e.g., individual transistors, groups of transistors) of a die 532 formed with compound semiconductor materials (e.g., group III-V materials, gallium arsenide (GaAs), gallium nitride (GaN), compound semiconductor die, etc.) or organic materials is coupled with electrical connections 542-545 (e.g., solder balls, bumps, etc.) to the die 510. The circuitry or devices of a die 536 formed with compound semiconductor materials (e.g., group III-V materials, gallium arsenide (GaAs), gallium nitride (GaN), compound semiconductor die, etc.) or SOI or organic materials is coupled with electrical connections 551 and 559 to the redistribution layer 541. The IPD 550 (or other component) includes electrical connections 546-549 for routing signals to the die 510 or to the substrate 550 using redistribution layer 541 (or routing layer 541). The overmolded component 522 includes an overmold 523 that partially or completely surrounds the dies 530, 532, and 536.

The substrate 550 includes an antenna unit 552 with at least one antenna for transmitting and receiving high frequency communications (e.g., 5G, WiGig, at least 25 GHz, at least 28 GHz, at least 30 GHz). The substrate 550 may optionally include various components (e.g., switches, switches formed in compound semiconductor materials, any type of device or circuitry, filters, combiners, etc). Additional components such as traditional surface-mount passives may also be mounted to the package. The substrate 550 includes conductive layers 553-555 of the antenna unit 552. In this example, the electrical connections 526 and 527 and redistribution layers 540 and 541 couple the die 510 to the antenna unit 552. The substrate 550 includes one or more dielectric layers 559 for isolation between conductive layers 553-555.

The substrate 550 can have a different layer count, thickness, length, and width dimensions in comparison to the layer count, thickness, length, and width dimensions of the substrate 550 of FIG. 5. In one example, components of the substrate which primarily dominate a packaging area are partitioned in a separate lower cost and lower circuit density substrate 550 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one embodiment, the device 500 is a wireless module that includes at least one CMOS die 510 functioning as baseband, transceiver, or a combination of both. Off-chip passive components are integrated on a semi-insulating or fully insulating semiconductor substrate to achieve digital, analog, and RF functionalities. Furthermore, group III-V circuits are used for a substantial portion of the RF front end functions. The dies are interconnected together either directly or through a molding compound that may have electrically conductive traces. The whole inter-die fabric is attached a package fabric (e.g., substrate 550) that incorporates one or more antennas to support communication at low GHz and mm-wave frequencies. Other discrete dies or passive components include crystals and connections that may also be attached to the package substrate.

In one example, the die 510 can have dimensions ranging from approximately 200×200 microns to 3×3 millimeter. The dimensions of the die 510 are smaller than the dimensions of the combination of dies attached on top of the die 510. In one embodiment, the antenna unit 552 is located on the microelectronic device 500 as close as possible to power amplifiers (e.g., power amplifiers of dies 532 or 536) to minimize path losses.

Figure 6:
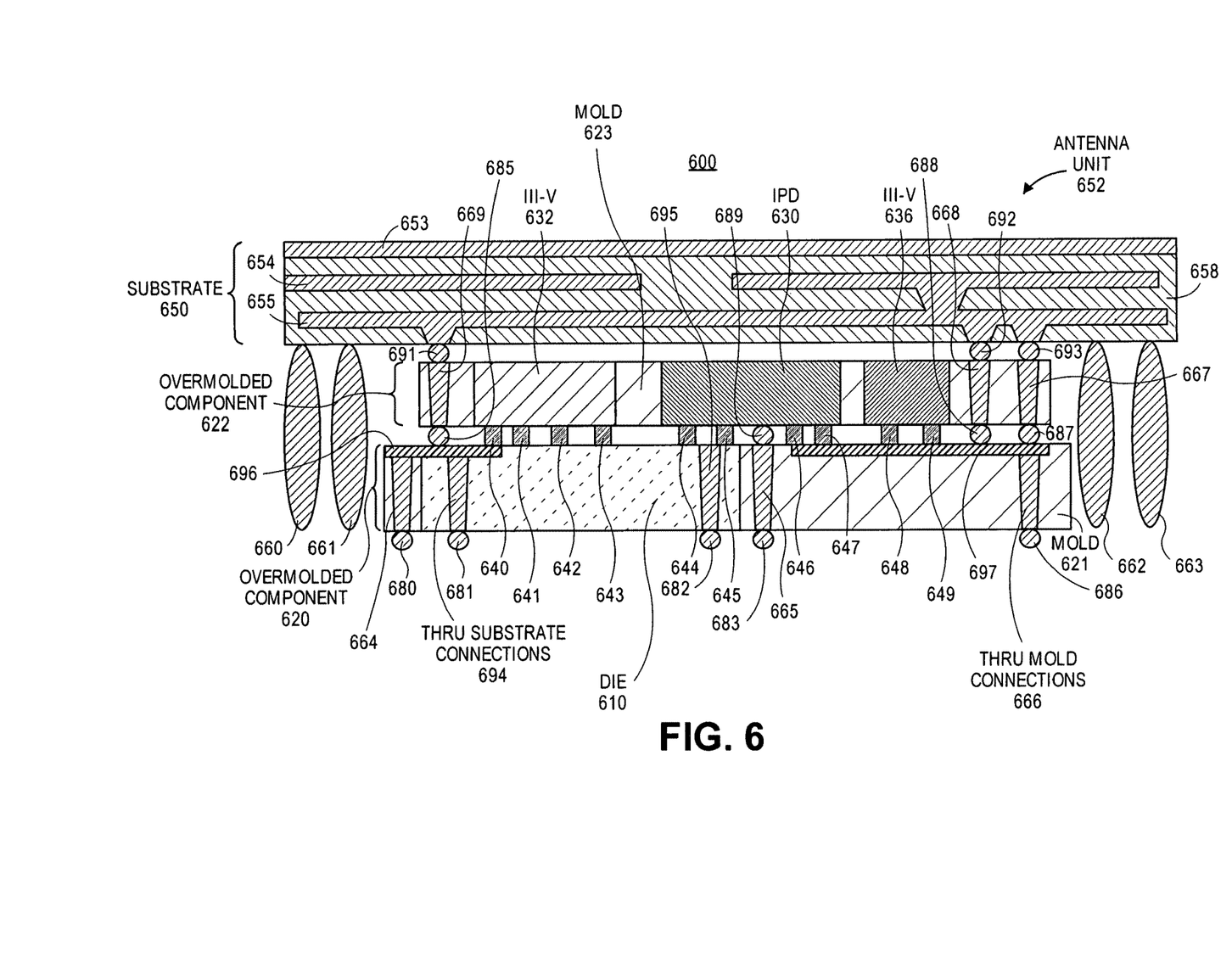
FIG. 6 illustrates co-integrating different components in a microelectronic device (e.g., a die fabric architecture) having multiple overmolded components in accordance with one embodiment.

FIG. 6 illustrates co-integrating different components in a microelectronic device (e.g., a die fabric architecture) in accordance with one embodiment. The microelectronic device 600 (e.g., a die fabric architecture 600) includes an overmolded component 620, overmolded component 622, and a substrate 650. The overmolded component 620 includes an overmold (e.g., mold 621) that partially or completely surrounds CMOS circuitry of a die 610 (e.g., die with silicon based substrate, CMOS circuitry having at least one baseband unit and at least one transceiver unit formed with a silicon based substrate, CMOS die). The mold material 621 may be a low loss nonconductive dielectric material and the shielding may be made out of a conductive material. Circuitry or devices (e.g., individual transistors, groups of transistors) of a die 632 formed with compound semiconductor materials (e.g., group III-V materials, gallium arsenide (GaAs), gallium nitride (GaN), compound semiconductor die, etc.) or organic materials is coupled with electrical connections 640-643 to the die 610. The circuitry or devices of a die 636 formed with compound semiconductor materials (e.g., group III-V materials, gallium arsenide (GaAs), gallium nitride (GaN), compound semiconductor die, etc.) or SOI or organic materials is coupled with electrical connections 648 and 649 to the redistribution layer 697. The IPD 630 (or other component) includes electrical connections 644-645 for routing signals to the die 610 and electrical connections 646-647 for routing signals to the redistribution layer 697 (or routing layer 697). The overmolded component 622 includes an overmold 623 that partially or completely surrounds the dies 630, 632, and 636.

The substrate 650 includes an antenna unit 652 with at least one antenna for transmitting and receiving high frequency communications (e.g., 5G, WiGig, at least 25 GHz, at least 28 GHz, at least 30 GHz). The substrate 650 may optionally include various components (e.g., switches, switches formed in compound semiconductor materials, any type of device or circuitry, filters, combiners, etc). Additional components such as traditional surface-mount passives may also be mounted to the package. The substrate 650 includes conductive layers 653-655 of the antenna unit 652.

In this example, the overmolded components 620 and 622 include electrical thru mold connections 664-669, electrical thru substrate connections 694-695, and associated solder balls or bumps 680-685, 687-689, and 691-693 for routing signals from the overmolded components to the substrate 650. The substrate 650 includes one or more dielectric layers 658 for isolation between conductive layers 653-655. Secondary level interconnects 660-663 provide electrical connections between the substrate 650 and other components or substrates.

The substrate 650 can have a different layer count, thickness, length, and width dimensions in comparison to the layer count, thickness, length, and width dimensions of the substrate 650 of FIG. 6. In one example, components of the substrate which primarily dominate a packaging area are partitioned in a separate lower cost and lower circuit density substrate 650 in comparison to other components, which may have high density interconnect (HDI) and impedance controlled interconnect. A substrate may be formed with low temperature ceramic materials, liquid crystal polymers, organic materials, glass, etc. HDI PCB technologies may include blind and/or buried via processes and possibly microvias with a higher circuit density than traditional PCBs.

In one embodiment, the device 600 is a wireless module that includes at least one CMOS die 610 functioning as baseband, transceiver, or a combination of both. Off-chip passive components are integrated on a semi-insulating or fully insulating semiconductor substrate to achieve digital, analog, and RF functionalities. Furthermore, group III-V circuits are used for a substantial portion of the RF front end functions. The dies are interconnected together either directly or through a molding compound that may have electrically conductive traces. The whole inter-die fabric is attached a package fabric (e.g., substrate 650) that incorporates one or more antennas to support communication at low GHz and mm-wave frequencies. Other discrete dies or passive components include crystals and connections that may also be attached to the package substrate.

In one example, the die 610 can have dimensions ranging from approximately 200×200 microns to 3×3 millimeter. The dimensions of the die 610 are smaller than the dimensions of the combination of dies attached on top of the die 610. In one embodiment, the antenna unit 652 is located on the microelectronic device 600 as close as possible to power amplifiers (e.g., power amplifiers of dies 632 or 636) to minimize path losses.

Figure 7:
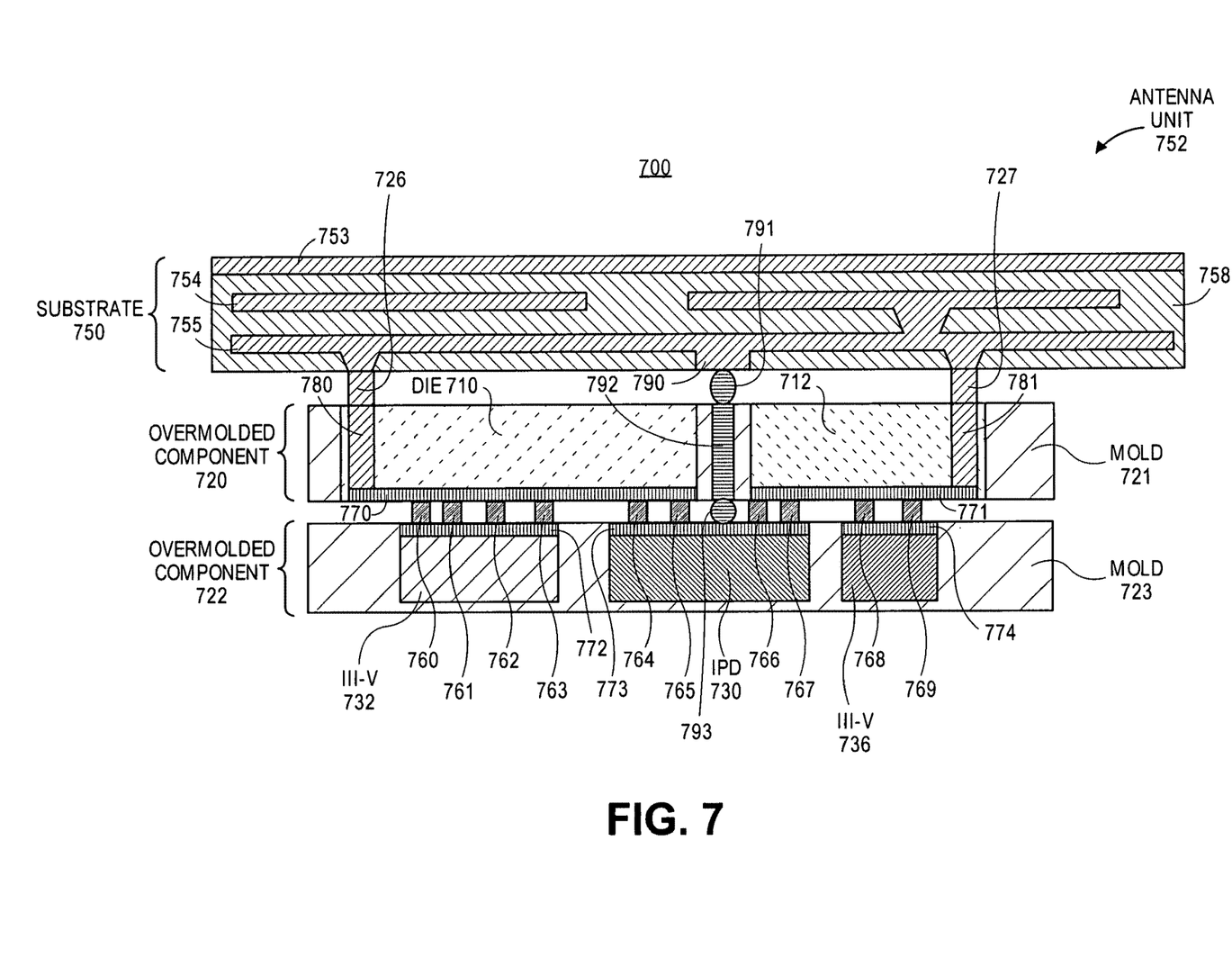
FIG. 7 illustrates co-integrating different components in a microelectronic device (e.g., a die fabric architecture) in accordance with an alternative embodiment.

In one embodiment, the devices 300, 400, 500, and 600 includes a CMOS silicon based die in a lower overmolded component and group III-V dies in an upper overmolded component. In an alternative embodiment, the devices 300, 400, 500, and 600 can be modified to include a CMOS silicon based die that is located in an upper overmolded component and the group III-V dies are located in a lower overmolded component. FIG. 7 illustrates an example of this alternative embodiment.

FIG. 7 illustrates co-integrating different components in a microelectronic device (e.g., a die fabric architecture) in accordance with an alternative embodiment. The microelectronic device 700 (e.g., a die fabric architecture 700) includes an overmolded component 720, an overmolded component 722, and a substrate 750. The overmolded component 720 includes an overmold that partially surrounds CMOS circuitry of a die 710 (e.g., die with silicon based substrate, CMOS circuitry having at least one baseband unit and at least one transceiver unit formed with a silicon based substrate, CMOS die) and optional component 712 (e.g., IPD 712, filter 712, group III-V die, SOI die, etc.). The mold material 721 may be a low loss nonconductive dielectric material and the shielding may be made out of a conductive material. Circuitry or devices (e.g., individual transistors, groups of transistors) of a die 732 formed with compound semiconductor materials (e.g., group III-V materials, gallium arsenide (GaAs), gallium nitride (GaN), compound semiconductor die, etc.) or organic materials is coupled with electrical connections 760-763 to the die 710. The circuitry or devices of a die 736 formed with compound semiconductor materials (e.g., group III-V materials, gallium arsenide (GaAs), gallium nitride (GaN), compound semiconductor die, etc.) or SOI or organic materials is coupled with electrical connections 768-769 to the component 712. The IPD 730 (or other component) can function as a bridge between die 710 and component 712 based on the electrical connections 764-767. The overmolded component 722 includes an overmold 723 that partially or completely surrounds the dies 732, 730, and 736.

The substrate 750 includes an antenna unit 752 with at least one antenna for transmitting and receiving high frequency communications (e.g., 5G, WiGig, at least 25 GHz, at least 28 GHz, at least 30 GHz). The substrate 750 may optionally include various components (e.g., switches, switches formed in compound semiconductor materials, any type of device or circuitry, filters, combiners, etc). Additional components such as traditional surface-mount passives may also be mounted to the package. The substrate 750 includes conductive layers 753-755 of the antenna unit 752. In this example, the electrical connections 726 and 727 and optional through silicon connections 780 and 781 couple the die 710 and the component 712 to the substrate 750 and antenna unit 752. The substrate 750 includes one or more dielectric layers 758 for isolation between conductive layers 753-755. In another example, the device 700 does not include through silicon connections 780 and 781. The electrical connections 790-793 (e.g., bumps, solder balls, pillars, vias, conductive layers, etc.) including the thru mold connection 792 electrically couple the die 710, component 712, die 730, die 732, and die 736 to the substrate 750 and the antenna unit 752. The regions 770-774 indicate active regions or areas having active circuitry of the die 710, component 712 (e.g., passive components), die 732, die 730, and die 736, respectively. These dies and components are assembled face to face to reduce parasitic interconnect lengths.

In one example, the dies and components of FIGS. 1-6 are also assembled face to face to reduce parasitic interconnect lengths. For example, in FIG. 1, the active regions of the dies 110, 130, 132, 136, and component 112 are in close proximity to the electrical connections 160-169. In another example, in FIG. 2, the active regions of the dies 210, 230, 232, 236, and component 212 are in close proximity to the electrical connections 260-270. In another example, in FIG. 3, the active regions of the dies 310, 330, 332, 336, and component 312 are in close proximity to the electrical connections 360-369. In another example, in FIG. 4, the active regions of the dies 410, 430, 432, 436, and component 412 are in close proximity to the electrical connections 449-449. In another example, in FIG. 5, the active regions of the dies 510, 530, 532, and 536 are in close proximity to the electrical connections 542-549, 551, and 558. In another example, in FIG. 6, the active regions of the dies 610, 630, 632, and 636 are in close proximity to the electrical connections 640-649.

The substrate 750 can have a different layer count, thickness, length, and width dimensions in comparison to the layer count, thickness, length, and width dimensions of the substrate 750 of FIG. 7. In one embodiment, the device 700 is a wireless module that includes at least one CMOS die 710 functioning as baseband, transceiver, or a combination of both. Off-chip passive components are integrated on a semi-insulating or fully insulating semiconductor substrate to achieve digital, analog, and RF functionalities. Furthermore, group III-V circuits are used for a substantial portion of the RF front end functions. The dies are interconnected together either directly or through a molding compound that may have electrically conductive traces. The whole inter-die fabric is attached a package fabric (e.g., substrate 750) that incorporates one or more antennas to support communication at low GHz and mm-wave frequencies. Other discrete dies or passive components include crystals and connections that may also be attached to the package substrate.

In one example, the die 710 can have dimensions ranging from approximately 200×200 microns to 3×3 millimeter. The dimensions of the die 710 are smaller than the dimensions of the combination of dies attached below the die 710 and component 712.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. En other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 8:
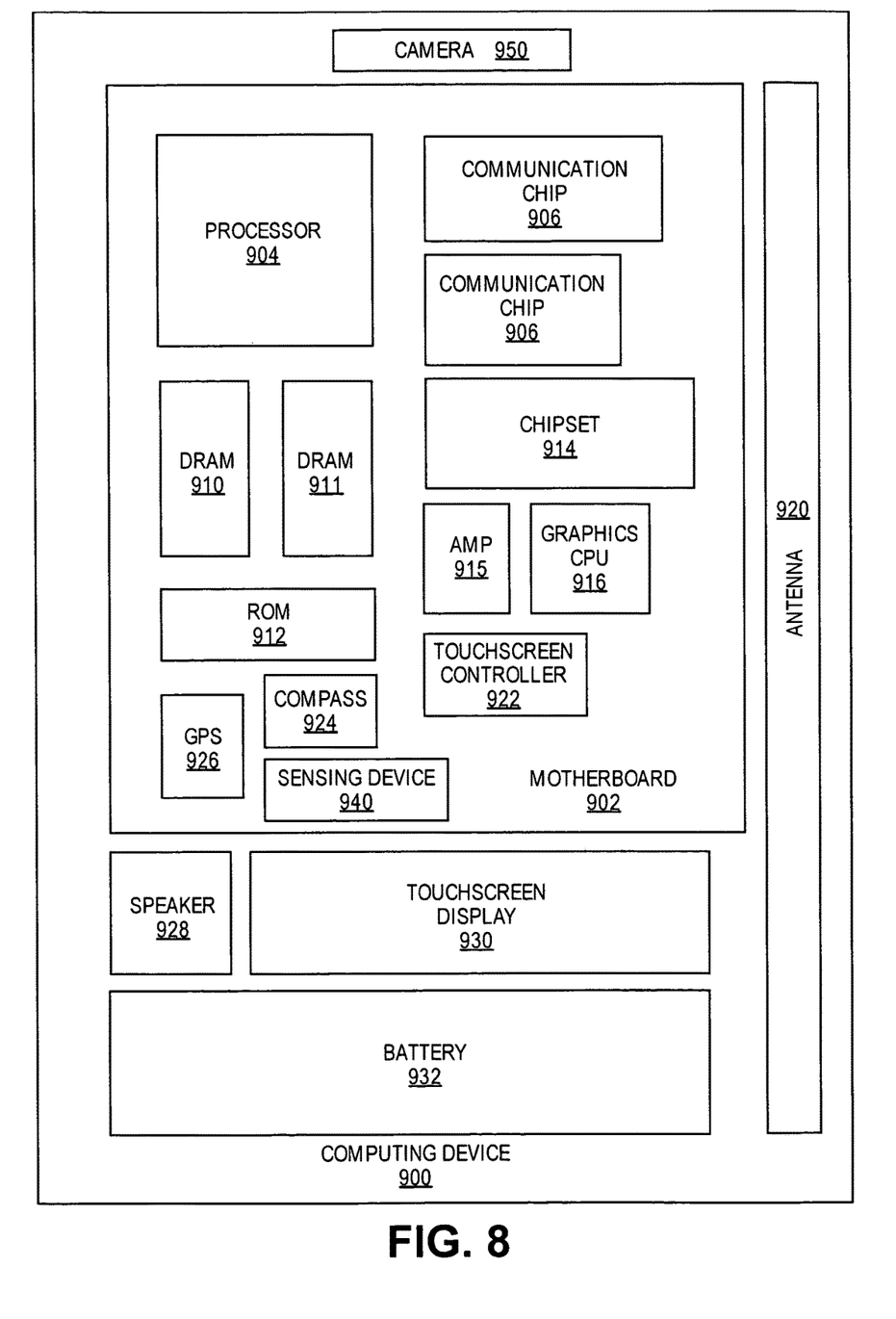
FIG. 8 illustrates a computing device 900 in accordance with one embodiment.

FIG. 8 illustrates a computing device 900 in accordance with one embodiment of the invention. The computing device 900 houses a board 902. The board 902 may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, 500, 600, etc.) includes an antenna unit 920.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM. GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE. Ev-DO, 5G, and others.

The at least one processor 904 of the computing device 900 includes an integrated circuit die packaged within the at least one processor 904. In some implementations of the invention, the integrated circuit die of the processor includes one or more devices, such as microelectronic devices (e.g., microelectronic device 100, 200, 300, 400, 500, 600, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 100, 200, 300, 400, 500, 600, etc.).

The following examples pertain to further embodiments. Example 1 is a microelectronic device that includes an overmolded component that includes a first die having a silicon based substrate, a second die that is coupled to the first die with the second die being formed with compound semiconductor materials in a different substrate. A substrate is coupled to the first die. The substrate includes an antenna unit for transmitting and receiving communications at a frequency of approximately 4 GHz or higher.

In example 2, the subject matter of example 1 can optionally include at least one integrated passive die (IPD) that is coupled to at least one die (e.g., the first die). The IPD may include passives for passive matching networks.

In example 3, the subject matter of any of examples 1-2 can optionally include at least one IPD that is located within the overmolded component.

In example 4, the subject matter of any of examples 1-3 can optionally include the at least one IPD that is electrical coupled to the first die and another component located within the overmolded component.

In example 5, the subject matter of any of examples 1-4 can optionally include a third die coupled to the another component. The third die having at least one switch formed in compound semiconductor materials.

In example 6, the subject matter of any of examples 1-5 can optionally include an interposer substrate to provide a spacing between the first die and the substrate and to electrically couple the first die and the substrate.

In example 7, the subject matter of any of examples 1-6 can optionally include the interposer substrate comprises a shield for shielding RF signals of the second die and a power supply.

In example 8, the subject matter of any of examples 1-6 can optionally include the microelectronic device including a 5G package architecture for 5G communications.

Example 9 is a microelectronic device that includes a first overmolded component that includes a first die having a silicon based substrate, a second overmolded component that includes a second die that is coupled to the first die with the second die being formed with compound semiconductor materials in a different substrate. A substrate is coupled to at least one of the first die and the second die. The substrate also includes an antenna unit for transmitting and receiving communications at a frequency of approximately 15 GHz or higher.

In example 10, the subject matter of example 9 can optionally include at least one integrated passive die (IPD) coupled to at least one die. The IPD includes passives for passive matching networks.

In example 11, the subject matter of any of examples 9 and 10 can optionally include the at least one IPD being located within the first overmolded component.

In example 12, the subject matter of any of examples 9-10 can optionally include the at least one IPD being located within the second overmolded component and electrically coupled to the first die and another component located within the first overmolded component.

In example 13, the subject matter of any of examples 9-12 can optionally include a third die coupled to the another component. The third die includes at least one switch formed in compound semiconductor materials.

In example 14, the subject matter of any of examples 9-13 can optionally include the microelectronic device being a 5G package architecture for 5G communications.

Example 15 is a computing device comprising at least one processor to process data and a communication module or chip coupled to the at least one processor. The communication module or chip comprises a first overmolded component that includes a first die having a silicon based substrate and a second overmolded component that includes a second die that is coupled to the first die. The second die is formed with compound semiconductor materials. A substrate is coupled to at least one of the first die and the second die. The substrate includes an antenna unit for transmitting and receiving communications at a frequency of approximately 15 GHz or higher.

In example 16, the subject matter of example 15 can optionally include at least one integrated passive die (IPD) coupled to at least one die. The IPD includes passives for passive matching networks.

In example 17, the subject matter of any of examples 15-16 can optionally include the at least one IPD being located within the first overmolded component.

In example 18, the subject matter of any of examples 15-16 can optionally include the at least one IPD being located within the second overmolded component and electrically coupled to the first die and another component located within the first overmolded component.

In example 19, the subject matter of any of examples 15-18 can optionally include a redistribution layer for electrically coupling the first and second dies to the substrate, a plurality of thru mold connections of the second overmolded component, a plurality of thru mold connections of the first overmolded component, and at least one thru substrate connection of the first die.

In example 20, the subject matter of any of examples 15-19 can optionally include a memory, a display module, and an input module, the memory, display module and input module being in operative communication on a chip chipset platform and each other.

What is claimed is:

1. A microelectronic device comprising:
   an overmolded component that includes a first die having a silicon based substrate;
   a second die coupled to the first die;
   the second die being formed with compound semiconductor materials in a different substrate; and
   a substrate coupled to the first die, the substrate including an antenna unit for transmitting and receiving communications at a frequency of approximately 4 GHz or higher, wherein the second die is between the overmolded component and the substrate.

2. The microelectronic device of claim 1, further comprising:
   at least one integrated passive die (IPD) coupled to at least one die, the IPD includes passives for passive matching networks.

3. The microelectronic device of claim 2, wherein the at least one IPD is located within the overmolded component.

4. The microelectronic device of claim 2, wherein the at least one IPD is electrical coupled to the first die and another component located within the overmolded component.

5. The microelectronic device of claim 4, further comprising:
   a third die coupled to the another component, the third die having at least one switch formed in compound semiconductor materials.

6. The microelectronic device of claim 1, further comprising:
   an interposer substrate to provide a spacing between the first die and the substrate and to electrically couple the first die and the substrate.

7. The microelectronic device of claim 6, wherein the interposer substrate comprises a shield for shielding RF signals of the second die and a power supply.

8. The microelectronic device of claim 1, wherein the microelectronic device comprises a 5G package architecture for 5G communications and beyond.

9. A microelectronic device comprising:
   a first overmolded component that includes a first die having a silicon based substrate;
   a second overmolded component that includes a second die that is coupled to the first die;
   the second die being formed with compound semiconductor materials in a different substrate; and
   a substrate coupled to at least one of the first die and the second die, the substrate including an antenna unit for transmitting and receiving communications at a frequency of approximately 15 GHz or higher, wherein one of the first overmolded component and the second overmolded component is between the substrate and the other of the first overmolded component and the second overmolded component.

10. The microelectronic device of claim 9, further comprising:
    at least one integrated passive die (IPD) coupled to at least one die, the IPD includes passives for passive matching networks.

11. The microelectronic device of claim 10, wherein the at least one IPD is located within the first overmolded component.

12. The microelectronic device of claim 10, wherein the at least one IPD is located within the second overmolded component and electrically coupled to the first die and another component located within the first overmolded component.

13. The microelectronic device of claim 12, further comprising:
    a third die coupled to the another component, the third die having at least one switch formed in compound semiconductor materials.

14. The microelectronic device of claim 9, wherein the microelectronic device comprises a 5G package architecture for 5G communications.

15. A computing device comprising:
    at least one processor to process data; and
    a communication module or chip coupled to the at least one processor, the communication module or chip comprises, a first overmolded component that includes a first die having a silicon based substrate;
    a second overmolded component that includes a second die that is coupled to the first die; the second die being formed with compound semiconductor materials; and
    a substrate coupled to at least one of the first die and the second die, the substrate including an antenna unit for transmitting and receiving communications at a frequency of approximately 15 GHz or higher, wherein one of the first overmolded component and the second overmolded component is between the substrate and the other of the first overmolded component and the second overmolded component.

16. The computing device of claim 15, further comprising:
    at least one integrated passive die (IPD) coupled to at least one die, the IPD includes passives for passive matching networks.

17. The computing device of claim 16, wherein the at least one IPD is located within the first overmolded component.

18. The computing device of claim 16, wherein the at least one IPD is located within the second overmolded component and electrically coupled to the first die and another component located within the first overmolded component.

19. The computing device of claim 15, further comprising:
- a redistribution layer for electrically coupling the first and second dies to the substrate:
    - a plurality of thru mold connections of the second overmolded component;
    - a plurality of thru mold connections of the first overmolded component;
- and
    - at least one thru substrate connection of the first die.

20. The computing device of claim 15, further comprising:
- a memory;
- a display module; and
- an input module, the memory, display module and input module being in operative communication on a chip chipset platform and each other.

* * * * *